United States Patent [19]

LoVasco et al.

[11] Patent Number: 4,878,611

[45] Date of Patent: Nov. 7, 1989

[54] PROCESS FOR CONTROLLING SOLDER JOINT GEOMETRY WHEN SURFACE MOUNTING A LEADLESS INTEGRATED CIRCUIT PACKAGE ON A SUBSTRATE

[75] Inventors: Francis LoVasco, Roxbury Township; Michael A. Oien, Chatham Township, both of Morris County, N.J.

[73] Assignee: American Telephone and Telegraph Company, AT&T Bell Laboratories, Murray Hill, N.J.

[21] Appl. No.: 207,003

[22] Filed: Jun. 9, 1988

Related U.S. Application Data

[63] Continuation of Ser. No. 868,988, May 30, 1986, abandoned.

[51] Int. Cl.[4] .............................................. B23K 31/02
[52] U.S. Cl. .................................. 228/180.2; 228/245; 228/246
[58] Field of Search ...................... 228/180.2, 245, 246

[56] References Cited

U.S. PATENT DOCUMENTS

| | | | |
|---|---|---|---|
| 3,486,223 | 12/1969 | Butera | 228/180.2 |
| 3,591,839 | 7/1971 | Evans | 228/180.2 |
| 3,811,186 | 5/1974 | Larnerd et al. | 29/626 |
| 3,827,918 | 8/1974 | Ameen et al. | 117/6.2 |
| 3,835,531 | 9/1974 | Luttmer | 29/625 |
| 4,352,449 | 10/1982 | Hall et al. | 228/123 |
| 4,412,642 | 11/1983 | Fisher, Jr. | 228/173 R |

FOREIGN PATENT DOCUMENTS 2351056 12/1972 Fed. Rep. of Germany ... 228/180.2

OTHER PUBLICATIONS

"Thermal Stress Resistant Solder Reflow Chip Joints", IBM Technical Disclosure Bulletin, Hamilton et al, vol. 14, No. 1, 6/71.
"Chip Leveling During Solder Reflow", IBM Technical Disclosure Bulletin, vol. 29, No. 6, Nov. 1986.
"Chip Mounting with Prestretched Joints", IBM Technical Disclosure Bulletin, Coombs, vol. 16, No. 3, Aug. 1973.
"Controlled Collapse Reflow Chip Joining", *IBM Journal of Research and Development*, L. F. Miller, May 1969, pp. 239-250.
"The Soldering of Micro Chip Carriers for PCB", *International Journal for Hybrid Microelectronics*, R. Kimoto et al., vol. 5, No. 2, Nov. 1982, pp. 296-299.
"Development of a New Micro-Solder Bonding Method for VLSIs", *Conference Proceedings for the Third Annual International Electronics Packaging Conference*, Itasca, Illinois, R. Satoh et al., Oct. 24-26, 1983, pp. 455-461.
"New Micro-Soldering Technology and Its Application to VLSI", *Fourth Annual International Electrical Packaging Conference*, M. Oshima et al., Oct. 29-31, 1984, Baltimore, Maryland, pp. 752-758.

Primary Examiner—Nicholas P. Godici
Assistant Examiner—William Scott Andes
Attorney, Agent, or Firm—Alfred G. Steinmetz

[57] ABSTRACT

A solder joint assembly technique applies controlled volumes of solder to pads of both package and substrate. The two units are positioned adjacent each other with the pads and solder deposits mechanically maintained in registration with each other. The assembly is reflowed and the final separation between package and substrate at which the resulting solder joint solidifies is mechanically controlled in order to control a geometry of the resultant solidified joint. The solder volume deposits may assume various forms including spherical bumps and solder paste deposits.

9 Claims, 9 Drawing Sheets

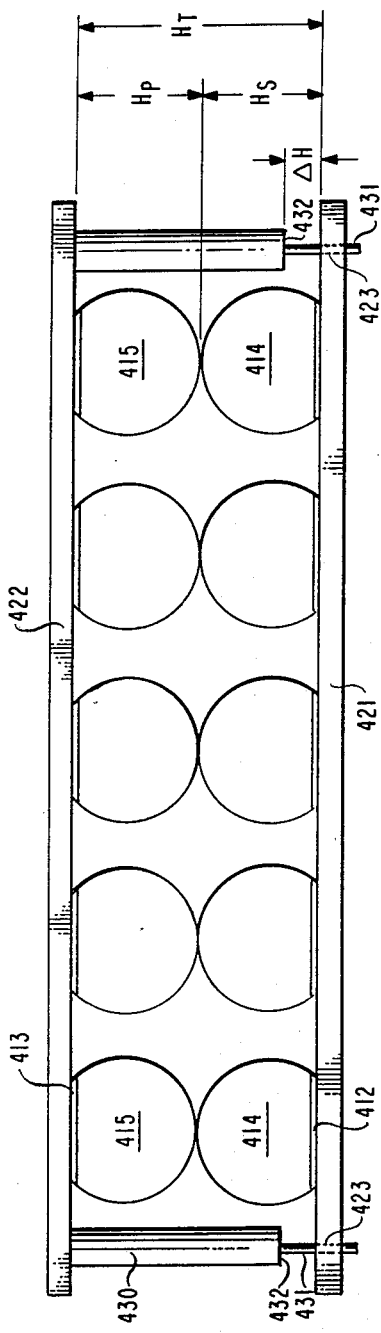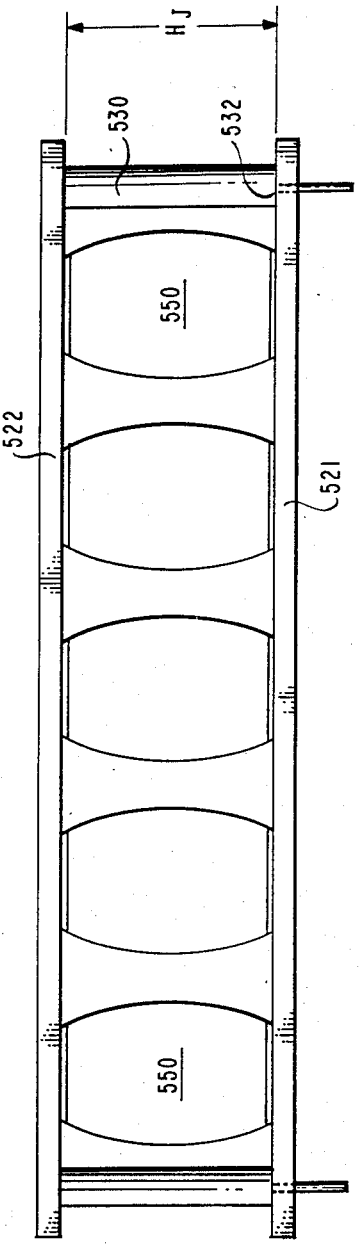

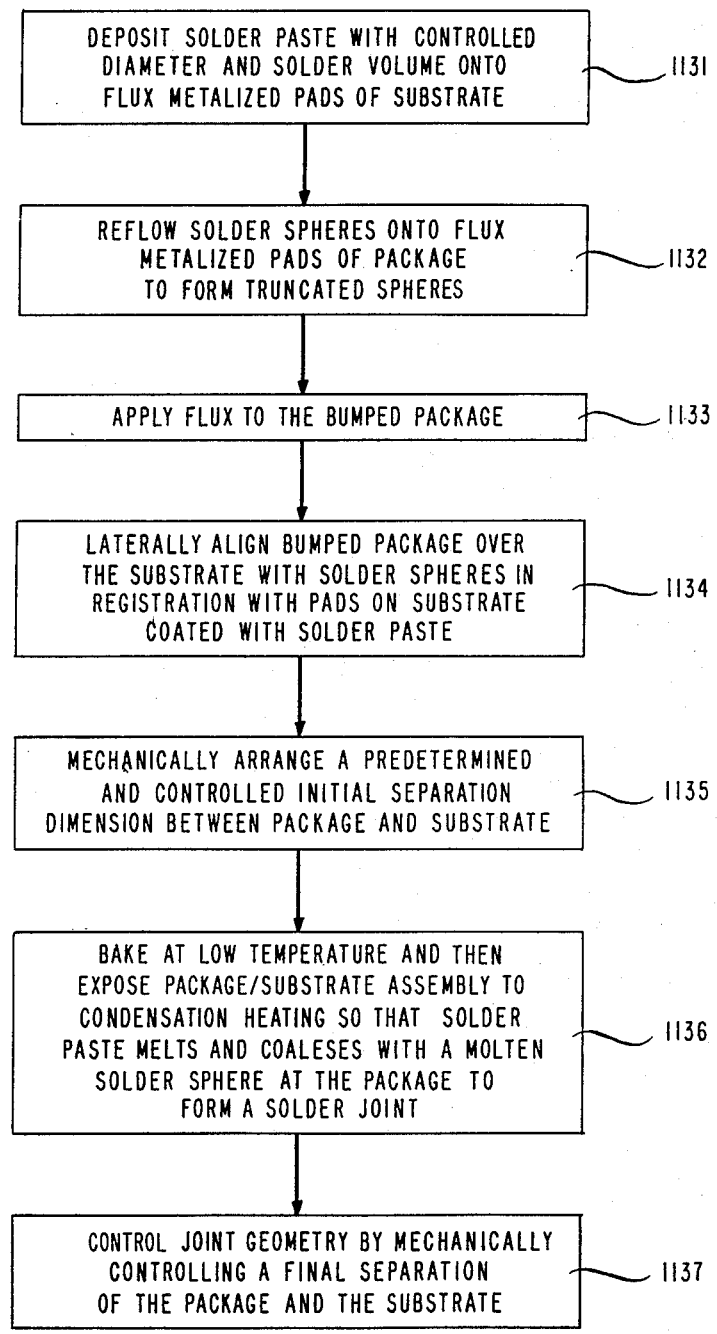

PROCESS FOR CONTROLLING SOLDER JOINT GEOMETRY WHEN SURFACE MOUNTING A LEADLESS INTEGRATED CIRCUIT PACKAGE ON A SUBSTRATE

This application is a continuation of application Ser. No. 868,988, filed May 30, 1986, now abandoned.

BACKGROUND OF THE INVENTION

This invention relates principally to the surface mount solder assembly of leadless integrated circuit packages to a substrate and particularly to a process for controlling a geometry of a solder joint.

A major problem in the solder assembly of leadless integrated circuit packages to a substrate is the reliability of the solder joints. These solder joints are commonly subjected to severe thermo-mechanically induced stresses and strains principally due to the unequal thermal expansion of the integrated circuit package and the substrate. The large temperature excursions which tend to occur regularly over the life of electronic systems give rise to moderately large cyclic plastic strains in the solder joints which in turn may result in low cyclic fatigue failures in the joints. In addition, flexing of the substrate relative to the integrated circuit package may induce additional stresses and strains in the solder joints.

Another problem is the tendency of solder joints to fail to form properly during the soldering process. The solder may fail to properly wet the terminal pads or lands of the integrated circuit package or substrate and thereby produce a mechanically and electrically unsound solder joint, or adjacent joints may bridge, thereby, interconnecting two terminals that are otherwise to be electrically isolated from one another. The large package size and high density of interconnections of high lead count VLSI chip packages significantly aggravates the problem of producing assuredly reliable solder joints.

The various thermo-mechanically induced stresses and strains occur both within the solder joint and at the solder to package or solder to substrate interface. It has been found that considerable improvement in reliability may be achieved by producing elongated solder joints with a well controlled shape or geometry as opposed to accepting an amorphous or poorly controlled geometry or shape of the traditional lap solder joint.

While the implementation of the traditional lap solder joint is relatively simple, the increase in lead count of integrated circuit packages and the many problems enumerated above dictate that shaping techniques and alternative constructions be used in creating solder joints. Existing shaping techniques include solder bumping and casting tin pillars.

In solder bumping, solder preforms generally in the form of spheres, are initially bonded to the integrated circuit package terminal pads or lands. This package with its solder bumps is then placed over corresponding lands on the substrate and the solder is reflowed to form the electrical connection between the package and the substrate. Since the shape of the solder joint is primarily controlled by surface tension and package weight, the resulting shape of the solder joint has a truncated spherical geometry. The truncated spherical solder joint shape creates an acute angle at its junction with the land to which it is bonded. This angular junction is a source of high stress concentration at the interface between the solder joint and the pad to which it is bonded. The truncated spherical solder joint also has a poor strain distribution along the joint height, concentrating the plastic strain in low cross sectional areas near the aforementioned interfaces with the terminal pads. Consequently such joints are quite susceptible to low cycle fatigue failures. It is further apparent that the truncated spherical shape characteristic of solder bumping is undersirable for high lead densities since tall joints may not be produced without also producing wide joints and closely spaced solder joints may tend to bridge with one another.

An improvement over the conventional bumped solder joint is the cast tin pillar joint. In this approach, a tin pillar is first cast onto each of the terminal pads of the integrated circuit package. Solder paste is deposited onto the lands of the substrate and the package with its cast pillars is then placed over the corresponding lands of the substrate and reflow soldered to form a butt joint between the cast tin pillar and the associated substrate land. The combined cast tin pillar and solder butt joint together form a somewhat hourglass shaped joint. This shape significantly reduces the stress induced in the cast pillar to terminal pad interface and the solder joint to land interface and thereby increases the joint reliability. Taller joints may be produced with this technique so that the strain levels are reduced and the strains are more favorably distributed throughout the volume of the joint as compared with joints formed with conventional solder bumping techniques. The resulting joint shape is thus more forgiving of differential temperature expansion of substrate and package in terms of stress induced in the joint.

A solder bumping technique is disclosed by P. M. Hall et al., in U.S. Pat. No. 4,352,449, issued October 5, 1982. Preforms or solder spheres are applied to the terminal pads of the integrated circuit package and reflowed to form solder bumps on the package. This package with its solder bumps is then placed over corresponding lands on the substrate and the solder is reflowed to form an electrical connection between the package and the substrate. During reflow the weight of the package is supported by the molten solder joints which are contained by surface tension. By careful selection of the size of the applied solder spherical preforms, based on an engineering analysis, the final separation between the package and substrate can be well controlled. This method, however, does not permit the desired degree of control over the final shape or geometry of the solder joint.

A solder assembly technique using cast solder leads with pillar shapes is disclosed in U.S. Pat. No. 4,412,642 issued to J. R. Fisher on November 1, 1983. This technique utilizes a mold with shaped cavities to cast shaped tin pillars onto the pads of the package. Solder paste is deposited onto the lands of the substrate and the package with its cast pillars is then placed over the corresponding lands and reflow soldered to form a butt joint between the cast tin pillar and the associated substrate pad. The final separation between the package and the substrate is dependent on the height of the cast tin pillars and dependent on the degree to which these pillars are shortened by dissolution into the molten solder formed by the paste during the solder reflow assembly operation.

Another solder assembly method for forming circuit interconnections between adjacent circuit layers of a multilayer circuit structure is disclosed in U.S. Pat. No.

3,835,531, issued to W. Luttmer on Sept. 17, 1974. A pattern of conductive solder bumps or protrusions is formed on each layer with protrusions on one substrate aligned with protrusions on another substrate. An insulation layer of heat curable material is placed between the two substrates and the substrates are brought together so that the protrusions pierce the intervening insulation layer and corresponding protrusions contact one another. The intervening layer which is now contiguous to both substrates is heated and cured to form an adhesive bond. Finally the solder protrusions are fused to form a solder joint. To perform this process, an insulative layer must be provided which is readily pierced by dull solder protrusions such that they touch and can be reflowed together. Thus, nonuniformity of protrusion height or warpage of the substrates creates a possibility of noncontact, and hence uncertainty of making the desired connection. The resultant assembly is furthermore bonded together and not readily disassembled.

Yet another method of solder assembly is disclosed in U.S. Pat. No. 3,827,918, issued to T. J. Ameen et al., on August 6, 1974. The technique disclosed therein uses chromate conversion coatings adjacent to the lands as a barrier to prevent wicking of molten solder. Assembly is by deposition of solder mounds on the land areas on the substrate and circuit device followed by reflowing to melt the solder. This method does not permit the desired control over the solder joint shape or geometry.

Another solder assembly technique known as controlled collapse is disclosed in an article entitled, "Controlled Collapse Reflow Chip Jointing" by L. F. Miller in the *IBM Journal of Research and Development* of May, 1969. The collapse of solder deposits during reflow soldering is limited by limiting the solderable area of substrate lands and chip contact terminals to permit surface tension to support the chip device and maintain separation until the solder solidifies. In certain applications, solder is placed on a chip pad where no corresponding substrate pad exists so that the surface tension of this molten solder will operate solely to maintain a desired separation. This technique, again does not provide an adequate means of controlling the geometry of the resultant solder joints.

Another soldering method is disclosed by R. Kimeto et al., in an article entitled, "The Soldering Of Microchip Carriers For PCB" in the *International Journal For Hybrid Microelectronics;* Vol. 5, No. 2, November 1982, pp. 296–299, in which a solder bump is formed on an integrated circuit package and a solder pedestal is formed on the printed circuit board. The melting point of the solder bumps is higher than that of the solder pedestals. The solder bumps and solder pedestals are aligned with one another and heated to preconnect them and deform them so that height irregularities of bumps and pedestals are absorbed. When all terminals are in firm contact, the assembly is heated at a temperature between the two distinct melting points of the bumps and pedestals to form the final solder connection. No provision is made, however, to control the resultant solder joint geometry.

A variant of controlled collapse known as a self-stretching technique has been disclosed by Ryohey Satoh et al., in an article entitled "Development of a New Micro-Solder Bonding Method for VLSI" in *Conference Proceedings For The Third Annual International Electronics Packaging Conference,* Itasca, Illinois, dated October 24, 25 and 26, 1983. In this method, a controlled amount of solder having a given melting point is deposited on the pad areas of an integrated circuit package which are to be soldered to corresponding pad areas on a substrate. A second controlled volume of solder having a higher melting point is deposited as a sheet over and extending beyond a pad area on the substrate in an area in which there is no corresponding wettable surface on the chip package. Upon heating the joint, the low temperature solder melts first and makes the electrical connection. The control sheet melts subsequently and forms a quasi-spherical shape whose surface tension generates forces that move the chip and substrate away from each other to a desired distance.

This method does theoretically provide a means of controlling solder joint shape by using surface tension of the control sheet to support the package at a distance from the substrate in order to achieve a more reliable older joint geometry. However, the control of joint geometry and alignment of chip carrier and substrate is difficult to control precisely with this method, due to possible variations in process parameters such as surface tension of the solder as it is influenced by fluxing.

SUMMARY OF THE INVENTION

Therefore, in one solder assembly process, embodying the principles of the invention, solder spheres of predetermined and controlled volume are reflowed onto fluxed metalized pads of a package, the pads having a predetermined and controlled area. Similarly, solder spheres with a predetermined and controlled volume are reflowed onto fluxed metalized pads of a substrate, the pads having a predetermined and controlled area. In each case the solder bumps form truncated spheres. Flux is then applied to both package and substrate. The package is placed over the substrate foot print so that the solder bumps of both are aligned and are touching each other. This is accomplished in one illustrative embodiment disclosed herein by a pin arrangement whereby pins attached to one item fit into locating pin holes in the other item. The pins in this embodiment have shoulders with the smaller diameters of the free end engaging pin holes only large enough to accept the smaller diameter. Alternative embodiments are also disclosed in which the pins do not engage pin holes but instead engage only the surface of the substrate.

The package and substrate assembly is exposed to condensation heating or any other acceptable method of heating and the corresponding solder bumps of the package and substrate melt and coalesce together to form a solder joint. As the melting occurs, the resulting surface tension of the molten solder joints and gravity causes the package to sink toward the substrate. The predetermined and controlled height of the shoulders of the pins determines the final distance between the package and the substrate, and hence, results in a joint of a predetermined and desired geometry.

In another embodiment of the invention, solder spheres of predetermined and controlled volume are reflowed onto fluxed metalized pads of a package, the pads having a predetermined and a controlled area, and a predetermined and controlled amount of solder paste is deposited on lands of the substrate in the form of a disc larger in diameter than the land. The fluxed package is placed over the substrate footprint so that the solder bumps are aligned with the associated solder paste covered pads of the substrate. The assembly is subjected to reflow soldering so that the solder paste initially melts and tends to form a molten spherical shape and thereby joins with the associated solder sphere of the package to form a solder joint with controlled geometry. As in the above embodiment, the separation distance between the package and substrate is mechanically controlled to a predetermined level which will assure the melting together of the associated solder deposit on the package and the substrate to form a joint of predetermined and controlled geometry.

In yet another embodiment of the invention, solder paste discs of controlled volume are deposited on both package and substrate separated mechanically by a controlled distance. When the assembly is heated, both discs of solder paste first tend to coalesce into solder spheres and in doing so touch and join to form the solder joints with the desired joint shape.

Many other solder joint assembly processes may embrace the principles of the invention. Each process embodiment will encompass the provision of two substantial, predetermined and controlled volumes of solder to form a joint; one volume being deposited on each of the pads of the package and the other volume being deposited on each of the associated pads of the substrate, both pads individually being of predetermined and controlled size. The package is mechanically aligned over the substrate such that while the pads are horizontally aligned, vertical motion between the package and the substrate may be permitted. The assembly is heated so that the deposited solder melts and coalesces to form a single solder volume. A mechanical arrangement is utilized to control a final separation distance between the package and the substrate such that the forces of surface tension of the coalesced molten solder combined with the controlled separation distance, controlled solder deposit volumes and controlled pad sizes on package and substrate are operative to attain a predetermined and controlled solder joint geometry. The term substantial is mentioned above in connection with solder volumes indicates a volume of solder that is significantly larger than solder volumes used in conventional solder coating techniques such as solder plating or hot gas solder leveling of printed wiring board.

BRIEF DESCRIPTION OF THE DRAWINGS

FIG. 4 is a cross sectional view of a solder bumped package positioned on a solder bumped substrate prior to reflow soldering;

FIG. 5 is a cross sectional view of a package and substrate joined together by reflowed solder joints;

FIG. 11 is a diagram showing the process steps in creating a solder joint using a mixed technique of solder bumps and solder paste;

DETAILED DESCRIPTION

Figure 1:
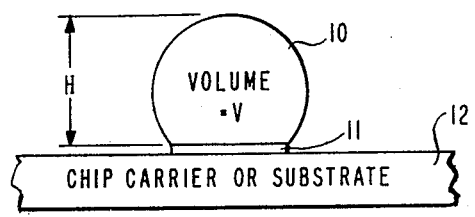
FIG. 1 is a cross sectional view of a truncated spherical solder bump bonded to a substrate or package.

A typical solder bump 10, as shown in FIG. 1, has a shape resembling a truncated sphere and is created by reflowing a controlled volume or amount of solder onto a fluxed metalized pad 11 affixed to the surface of a package or substrate 12. The solder sphere contains a predetermined volume V of solder material and has an overall height H above the surface of the pad 11 on substrate 12.

Figure 2:
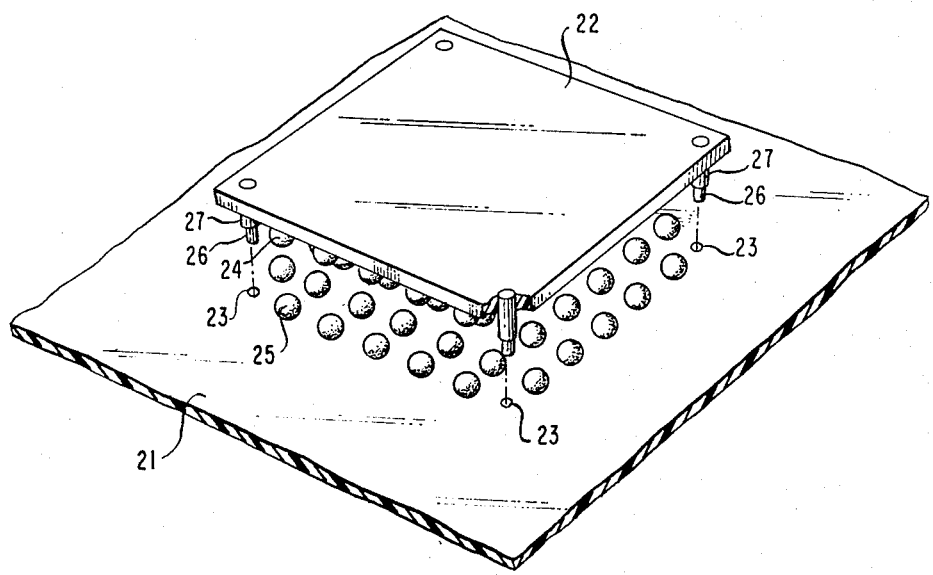
FIG. 2 is a fragmentary perspective of a solder bumped integrated circuit package positioned over the solder bumped pads of a substrate prior to the solder assembly operation.

As shown in a fragmentary perspective view in FIG. 2, solder bumps 25 and 24, as described above, are reflowed onto metalized pads of both a substrate 21 and an integrated circuit package 22, respectively. As shown, package 22 is positioned above a substrate 21 upon which it is to be mounted. The package 22 and substrate 21 may be an embodiment of a chip carrier and a printed circuit board, respectively. The pads on substrate 21 are identical in number and aligned with the pads on package 22. Lateral alignment of the bumps deposited on the pads of package 22 and substrate 21 is controlled by the pins 26, which as shown are bonded onto pads at the corners of the package 22. The pins include an end portion of reduced diameter which fits into alignment holes 23 in the substrate 21 and which pins further embody a shoulder 27 which rests upon the surface of the substrate 21 when the solder bumps are molten and have coalesced. The shoulder height of this pin determines the final stand-off or separation between the package and the substrate following solder reflow assembly, and hence the height of the solder joint. As discussed below, control of the diameter of the pads on the package and substrate, control of the solder volume deposited on these pads, and control of the final stand-off height between the package and the substrate results in a solder joint of controlled and predetermined geometry. The amount or size of the solder deposits required for this process may be quantified in terms of both package and substrate solder deposits being embodied in a single solder sphere which has a diametrical dimension that is smaller than the joint height dimension of the final solder joint.

Figure 3:
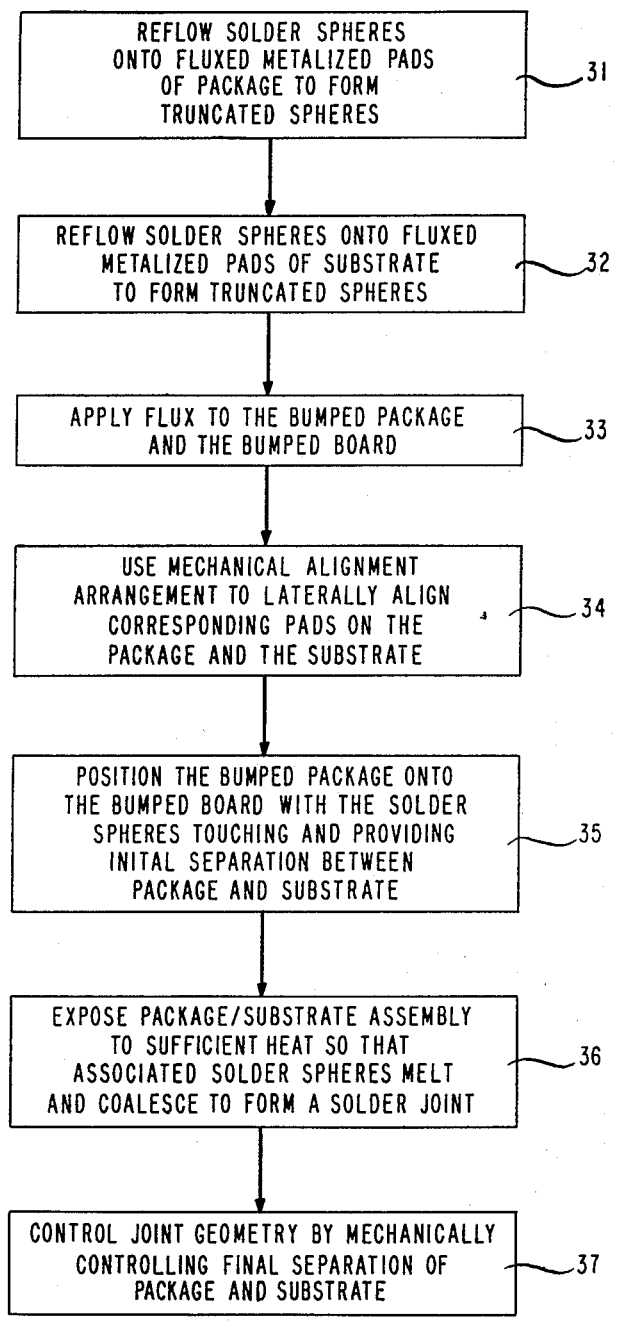
FIG. 3 is a diagram showing the process steps in creating a solder joint using solder bumps on both package and substrate according to the principles of the invention.

One solder assembly process to create solder joints according to the invention may be readily ascertained by reference to FIGS. 3, 4 and 5. As described in the process chart in FIG. 3, solder spheres are reflowed onto fluxed metalized pads on both the package and the substrate using solder bump technology as per process steps 31 and 32. Flux is applied to both the bumped package and the bumped substrate as per process step 33 to reduce the surface energy or surface tension of the solder sphere upon reflow, and hence enhance the process. This surface tension is a major factor in controlling the geometry of the resulting solder joint.

As shown in the cross sectional view of FIG. 4, a bumped package 422 is aligned over the bumped substrate 421, by process step 34 in FIG. 3 so that the pads 412 and 413 and the associated solder bumps 414 and 415 of both package and substrate are in good registration with each other. The alignment is attained in the illustrative embodiment by the pins 430 attached to the corners of the package and which have reduced diameter sections 431 that fit into holes 423 in the substrate. As shown, the solder bumps 415 of height $H_p$ on the package 422 touch the solder 414 of height $H_s$ on the substrate 421 in accordance with step 35 of FIG. 3.

The whole assembly is then subjected to a suitable form of heating such as condensation heating as per process step 36 in FIG. 3, which is appropriate for causing the contacting solder bumps to melt together and coalesce to form a solder joint 550, as shown in FIG. 5. As both solder spheres melt, the solder of both spheres coalesce into one molten volume. As the melting occurs, the surface tension of the resulting molten solder joints and gravity causes the package 522 to be pulled toward the substrate 521, and create a solder joint with controlled geometry.

The geometry of the resultant solder joint is controlled by mechanically controlling the final separation between the package and substrate as noted by step 37 in FIG. 3. This final separation at joint height, designated $H_J$ in FIG. 5, is limited by the shoulder 532 (shown also as 432 in FIG. 4) on the alignment pins which ultimately are contiguous with the surface of the substrate 521, as shown in FIG. 5. The joint height $H_J$, as shown in FIG. 5, is typically larger than that obtained by other assembly techniques which do not mechanically control the final separation distance between package and substrate.

The joint height $H_J$ is the sum of the individual sphere heights $H_p$ and $H_s$ minus an overlap dimension $\Delta H$, shown in FIG. 4. The overlap dimension $\Delta H$ is a key parameter in determining the manufacturably of the solder joint, as will be apparent from the discussion below. The coalescence of the associated solder bumps and the pulling together of the package and substrate upon reflow which were mentioned above is advantageous in the case of warping of the substrate relative to the package in that it allows solder bumps that do not initially touch when the package is placed above the substrate to eventually touch and melt together during the course of the assembly process. The larger the overlap dimension $\Delta H$, the greater the capacity to accommodate such warpage or nonuniformity of ball sizes or pad sizes in practicing the process.

While the illustrative embodiment shows that the solder bumps and pads of both the package and the substrate are of an equal size, this is not a requirement of the process. In fact, solder bumps and/or metalized pads of unequal size, may be used to achieve specific solder joint geometries as discussed herein below.

Figure 6:
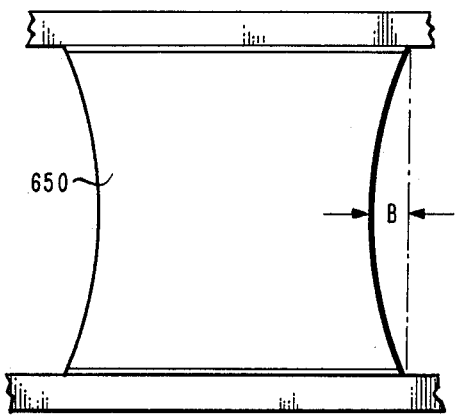
FIGS. 6, 7, 8 and 9 represent cross sectional views of various additional shapes the solder joints may be controlled to assume.
Figure 7:
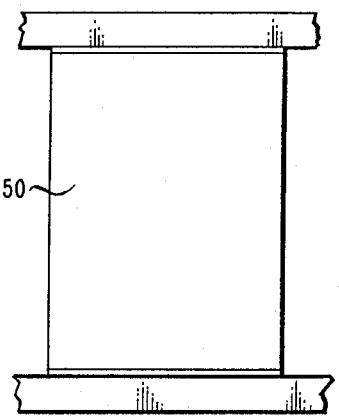
Figure 8:
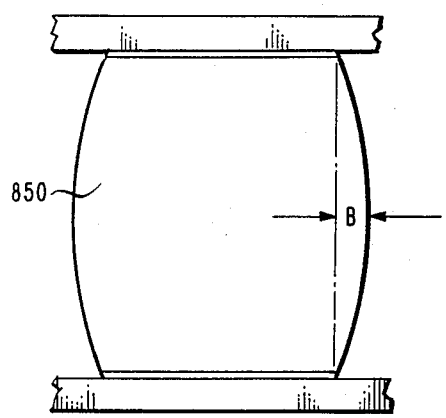
Figure 9:
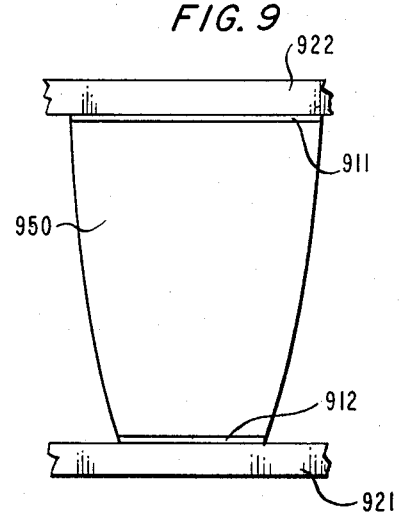

FIGS. 6, 7, 8 and 9 represent some typical solder joint geometries that may be attained through proper selection of desired parameters. In FIG. 6, a solder joint 650 with an hourglass geometry or negative curvature is illustrated and in FIG. 7, the solder joint 750 has an almost perfect cylindrical shape or zero curvature. A barrel shape joint 850 with positive curvature is shown in FIG. 8 and was also illustrated in FIG. 5. In FIG. 9, a solder joint 950 having a rounded truncated conical shape is attained by using different size metalized pads 911 and 912 on the package 922 and substrate 921, respectively.

The shape of the solder joint geometry may be precisely controlled through control of certain critical design parameters. These parameters are derived by considering that for small volumes of solder such as are used in solder joints, the influence of surface tension can be shown to be much greater than the influence of gravity in determining the final shape of the free surface of the solder joint. Hence, once the pad sizes, a controlled standoff height and solder volumes have been determined, the final shape or geometry of the joint is determined. Accordingly, the nominal controlling factors in the process comprise the package and substrate pad diameters or areas, the final joint height, the diameter and/or volume of the original solder spheres or bumps, and the available overlap of the solder which assures that they may coalesce.

The final shape of the solder joint may assume a cross sectional shape ranging from a negative curvature, to a positive curvature, as shown in FIGS. 6, 7, and 8. The final solder joint geometry, however, is restricted to within certain definable limits. There are stability limits wherein for a joint of a given volume a minimum solder joint height ($H_{min}$) is determined by a compressive limit and a maximum joint height ($H_{max}$) is determined by a tensile limit. In addition, there is a theoretical maximum joint height limit (corresponding to zero overlap) beyond which associated solder bumps will not touch and coalesce upon reflow.

Additional constraints on the solder joint geometry and uniformity are imposed by dimensional variations and practical manufacturing considerations such as the desire for a high yield process. Dimensional variations include tolerances in pad sizes, solder bump volumes, variations in overlap dimensions due to nonplanarity of package or substrate, and tolerances on dimensions of the pins provided the final mechanical separation.

The range of possible joint shapes of principal interest may be determined to good approximation through an analysis of a model in which the free surface of the solder joint is assumed to have a parabolic shape. The results of such an analysis is displayed in the graph of FIG. 10 in which various dimensionless shape curves for the solder joints are plotted as a function of the normalized diameter of spherical preforms used to form the bumps and the normalized stand-off height or joint height. All dimensions in the figure are normalized with respect to the pad diameter which in this case is assumed to be the same for the package and the substrate.

The free surface of the final solder joint is assumed to have a parabolic cross section as shown in either FIGS. 6 or 8. The parabolic geometry of the joint may be specified in terms of a bulge factor B as shown in FIGS. 6 and 8, which is defined as the bulging or bowing of the central joint radius form that of a perfect cylindrical surface. Using the parabolic representation, the shape of the solder joint may be characterized in terms of the initial volume of the solder bumps as represented by the spherical preform diameter "d", the bulge B, the final joint height $H_J$ and the equivalent pad diameter P.

The curves designated 101–107 represent constant shape curves of the free surface of the solder joint as formed by surface tension. These curves are derived from the above geometric considerations for a parabolic surface with a constant normalized bulge factor defined by $2B/P$ where B is the max deviation of the free surface from a cylinder as shown in FIGS. 6 and 8, and P is the pad diameter. For example, shape curve 103 has a designation $-0.2$ associated with it, meaning that it represents a negative curvature or hourglass shape as shown in FIG. 6. wherein $2B/P = -0.2$. Shape curve 104 with the designation 0 represents a zero curvature or cylindrical shape, as shown in FIG. 7. Shape curve 105 has a designation $+0.2$ which represents a positive curvature or barrel bulge like shape as shown in FIG. 8 where $2B/P + 0.2$.

The limit curves 111 and 112 labeled break line and collapse line, respectively, represent the stability limits of solder joint geometry as determined by the stability of the free surface of the solder joint formed by surface tension. The minimum stable joint height, defined by the collapse line 112 in FIG. 10, is approximated by the equation $$B = \tfrac{1}{8} H.$$

An upper stability limit on joint height is obtained when the gaussian curvature of an hourglass shaped joint equals zero. However, a lower meta-stable limit is attained when the free surface area of the solder bumps forming the joint is equal to the free surface area of the resulting solder joint. This meta-stable limit is shown by curve 111 in FIG. 10. The region between the stability curves 111 and 112 in FIG. 10 defines a region of physical existence, wherein stable molten solder joint geometries exist.

Figure 10:
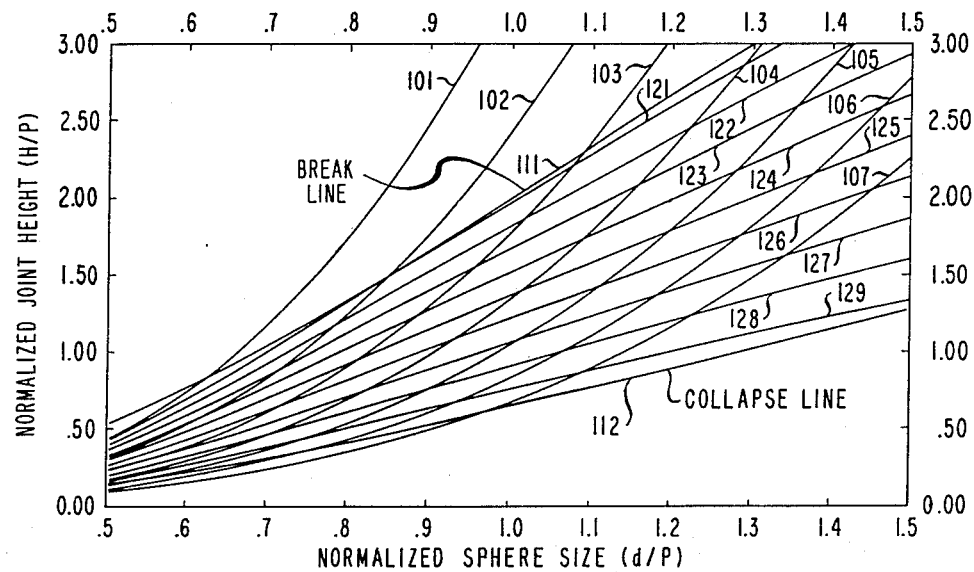
FIG. 10 is a graph relating solder sphere diameters and pad diameters to a resulting solder joint geometric characteristic.

The additional curves 121–129 in FIG. 10 are overlap curves based on the aforementioned overlap dimension $\Delta H$ and an overlap ratio $\alpha$ (alpha) and the fact that the original solder bump volumes must equal the final solder joint volume. Alpha is defined as $H_T/\Delta H$ in the curves. Negative alpha values such as $\alpha = -0.1$ for curve 123 indicate a situation wherein the final solder joint height exceeds the presolder separation between package and substrate whereas a positive value such as $\alpha = 0.2$ for curve 126 represents a solder joint height less than the presoldering separation.

It is readily apparent, to those skilled in the art, that any three of the design parameter may be initially chosen at will and by application of the curves the proper fourth design parameter may be determined which corresponds to a specific solder joint geometry. Zero overlap line 124 and collapse line 112 bound a region of physical existence for joint shapes obtainable using the above technique of solder bumping both package and substrate with equal size preforms on equal size pads. Various joint shapes within this existence region may be attained.

While circular pads have been illustrated in the illustrative embodiments, the scope of the invention is not intended to be limited to the use of circular pads on the package or the substrate. Various combinations of pad sizes and shapes may be used on both the package and the substrate. For square pads or rectangular pads which are nearly square, the design curves in FIG. 10 may be used to a reasonable degree of approximation by employing an equivalent pad diameter where the equivalent diameter of the non-circular pad is equal to the diameter of a circular pad having the same area.

The invention is also not to be considered restricted to the deposition of solder volumes on pads which would result in solder bumps having a diameter which is larger than the diameter or equivalent diameter of the pad. To provide a joint shape which is a significant improvement over existing technology it is required that a substantial volume of solder be deposited on the pads. The word substantial is used herein to mean a volume of solder deposited on a pad to be in excess of that volume of solder, which if reflowed, would form a bump for which the maximum height as measured from the pad surface is at least ten percent of the equivalent diameter of the pad. Thus a substantial volume of solder is generally well in excess of the amount of solder normally provided by conventional solder coating techniques used on printed wiring boards such as solder plating or hot gas solder leveling.

Figure 12:
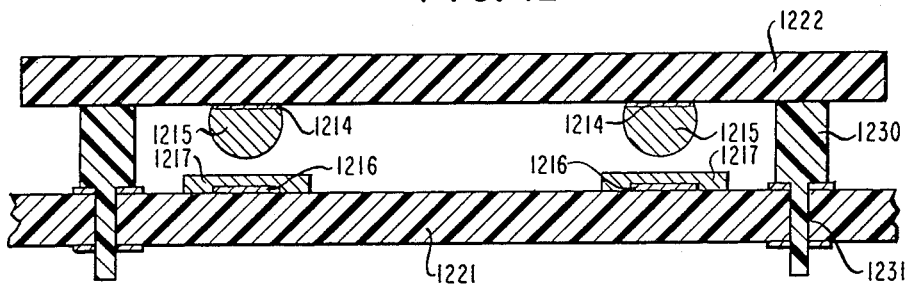
FIG. 12 is a cross sectional view of a prebumped package positioned to be joined to a substrate with solder paste deposits prior to reflow soldering.
Figure 13:
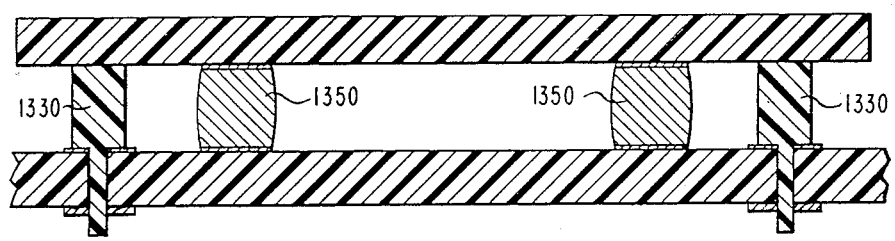
FIG. 13 is a cross sectional view of a package and substrate joined together by reflowed solder joints.

Another solder joint assembly process embodying the principles of the invention is detailed in the process chart of FIG. 11 and is illustrated in FIG. 12 and FIG. 13. For this process, as shown in steps 1131 and 1132 in FIG. 11, the package pads 1214 illustrated in FIG. 12 are bumped with solder spheres 1215 of controlled volume and a controlled volume of solder paste 1217 is deposited on the pads 1216 of the substrate by stenciling or other suitable techniques. Flux is applied to the solder bumps in step 1133 in FIG. 11 to activate the surface energy. The bumped and fluxed package is then placed over the substrate with the package pads 1214 in registration with the substrate pads 1216 as per process step 1134 in FIG. 11. This is illustrated in FIG. 12 showing the solder bumps 1215 on the package pads 1214 in registration with the associated substrate pads 1216 covered with a disc shaped deposit of solder paste 1217. The package and substrate are held apart at a fixed distance by the support posts 1230 affixed to the corners of the package 1222 and resting on the substrate 1221 as shown in FIG. 12 so as to provide the controlled separation called for in process step 1135 of FIG. 11. These posts 1230 also provide the lateral alignment called for in process step 1134. As indicated in process step 1136, the assembly is baked to evolve gases from the solder paste and then heated by condensation or other appropriate means wherein the disc shaped solder paste deposit 1217 illustrated in FIG. 12 tends to coalesce into a quasi-spherical shape and as a result contacts and joins together with the molten solder bumps 1215 of the package in order to form a solder joint 1350. As illustrated in FIG. 13 the posts 1330 (previously shown as 1230 in FIG. 12) provide control of the final separation between the package and the substance as called for in process step 1137 of FIG. 11.

Figure 14:
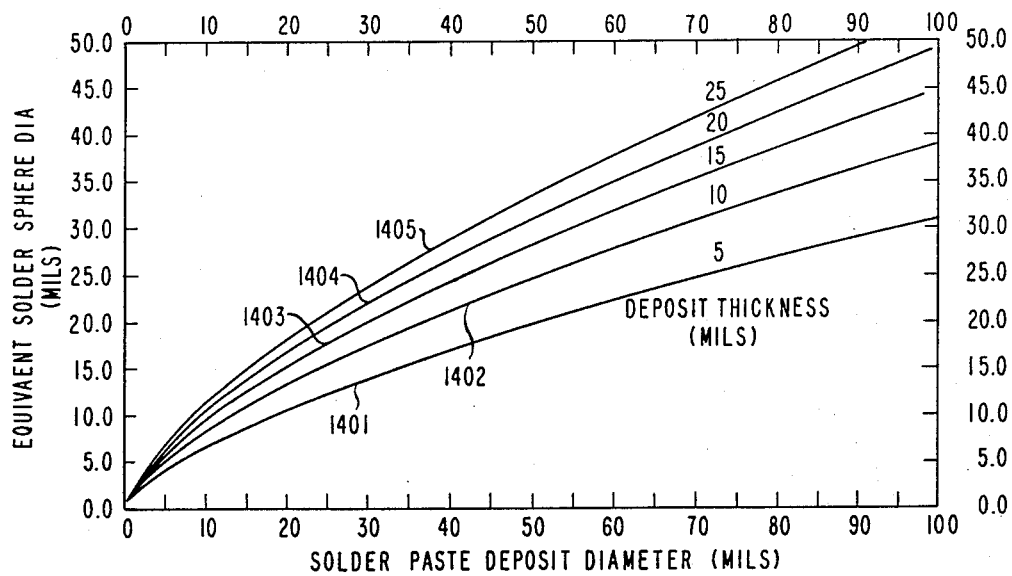
FIG. 14 is a graph showing volumetric equivalency of solder paste deposits of a given diameter and height to solder spheres of a given diameter.

The size of the stenciled disc shaped deposit of solder paste is initially selected so that it will assume an equivalent spherical shape of a predetermined size when it is molten. The equivalence of stenciled solder paste disc size to equivalent solder sphere size is given by the curves 1401 through 1405 in the graph of FIG. 14, wherein each individual curve is applicable for a particular solder paste disc thickness ranging from 5 to 25 mils as shown. In these particular curves, it is assumed that the metal fraction by volume in solder the paste is 0.4. Given a particular solder paste disc thickness, a particular disc diameter can be directly related to an equivalent solder sphere diameter, and the curves in FIG. 10 used for solder joint geometry design purposes.

Figure 15:
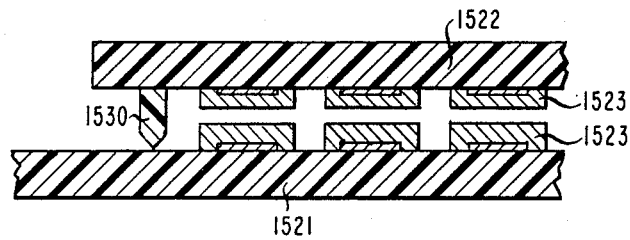
FIG. 15 is a cross sectional view of a package and substrate positioned to be joined together and having solder paste deposited on the pads of both package and substrate.
Figure 16:
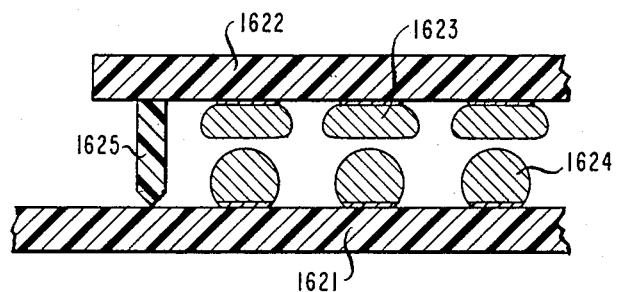
FIG. 16 is a cross sectional view of a package and substrate positioned to be joined together and the package having flattened solder bumps and the substrate having spherical solder bumps.

Many varied arrangements embodying the principles of the invention are shown in FIGS. 15 through 21. In the arrangement of FIG. 15 the pads of both package 1522 and substrate 1521 are coated with solder paste 1523 and a pointed standoff 1530 is used to determine the final joint height and maintain lateral alignment during solder reflow. In FIG. 16 the package 1622 has flattened solder spheres or bumps 1623 while the substrate 1621 contains spherical solder bumps 1624. The flattening of the bumps 1623 allows the pointed corner pins 1625 to touch substrate 1621 and maintain lateral alignment prior to solder reflow in addition to determine final joint height.

Figure 17:
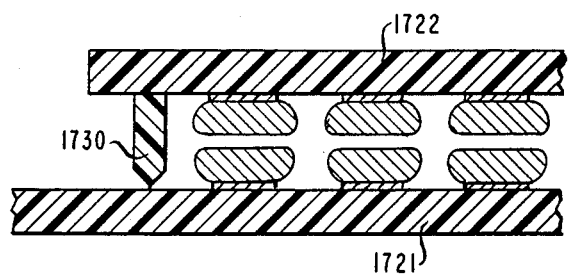
FIG. 17 is a cross sectional view of a package and substrate positioned to be joined together wherein both package and substrate have flattened solder bumps.
Figure 18:
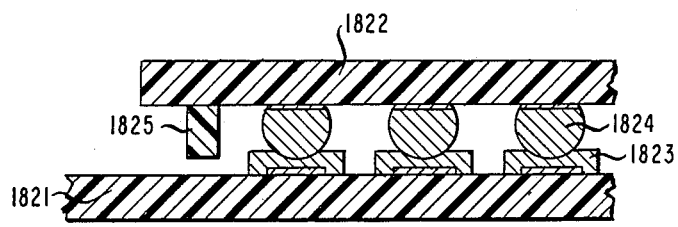
FIG. 18 is a cross sectional view of a package and substrate positioned to be joined together and where solder spheres of the package are immersed in the solder paste of the substrate.

Both the package 1722 and substrate 1721 in FIG. 17 have flattened solder bumps and a pointed standoff 1730. The solder bumps 1824 of the package 1822 in FIG. 18 are shown resting in the solder paste 1823 of the substrate 1821 before reflow. The solder paste is sticky and its adhesion maintains the lateral alignment between package 1822 and substrate 1821. Final separation between the two after reflow is controlled by the blunt corner pins 1825.

Figure 19:
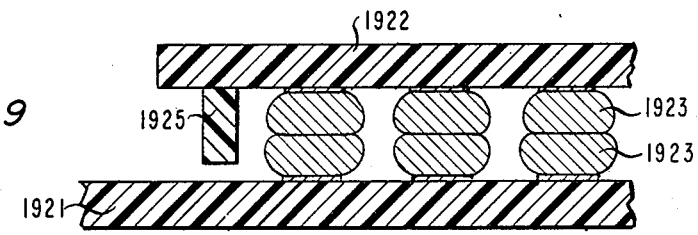
FIG. 19 is a cross sectional view of a package and substrate positioned to be joined together with both package and substrate having flattened solder spheres.

Flattened solder bumps 1923 on both the package 1922 and substrate 1921 are shown resting on one another in FIG. 19 to provide the initial separation. Sticky flux on the flattened bumps maintains the desired lateral alignment. After solder reflow the standoff 1925 determines the final joint height.

Figure 20:
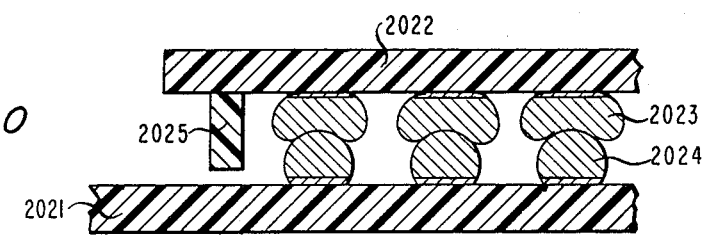
FIG. 20 is a cross sectional view of a package and substrate positioned to be joined together and having cupped solder deposits on the package which capture the solder spheres on the substrate.

A cupped solder deposit 2023 on the package 2022 is shown resting on the solder spheres 2024 of the substrate 2021 in FIG. 20 in a manner which provides both initial separation and lateral alignment. The corner pins 2025 control the final separation between package 2022 and substrate 2021 after solder reflow.

Figure 21:
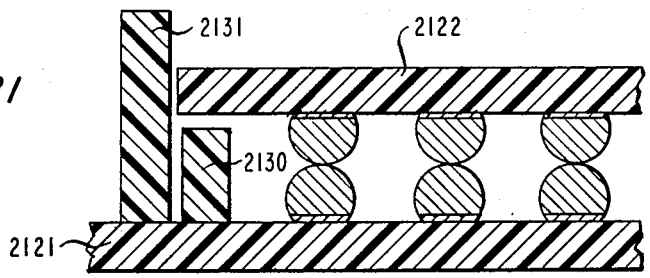
FIG. 21 is a cross sectional view of a package and substrate positioned to be joined together and having solder spheres deposited on both package and substrate.

In FIG. 21 a standoff 2130 is shown mounted on the substrate 2121 and a fixture 2131 provides lateral alignment.

It will be readily apparent to those skilled in the art, that the above solder joint assembly processes are only illustrative examples of many ways in which the practices of the invention may be embodied. For example, the techniques described herein may also be applied to the attachment of ceramic modules to a printed wiring board or the direct solder assembly of an integrated circuit chip to a substrate in the so called "flip chip" mode. Many other alternatives, within the scope of the invention, will be readily apparent to those skilled in the art.

What is claimed is:

1. A method of forming solder joints for joining a package and a substrate, comprising the steps of:

depositing substantial predetermined and controlled first volumes of solder all having a common specific melting point and in the form of spherical bumps on individual pads of a package, each of these pads having a predetermined and controlled size and shape, depositing substantial predetermined and controlled second volumes of solder all having a common melting point substantially equal to the common specific melting point and in the form of spherical bumps on individual pads of a substrate, each of these pads having a predetermined and controlled size and shape, the first and second solder volumes substantially equaling the total volume of the solder joint to be formed, laterally positioning the substrate and package adjacent to each other with individual pads of the package in registration with associated individual pads of the substrate, establishing an initial vertical separation between the package and the substrate which is small enough to allow the predetermined and controlled volumes of solder on each associated pair of pads to touch and coalesce when molten, applying sufficient heat to an assembly of the package and substrate to achieve a predetermined reflow temperature, such that the first and second volume of solder on each associated pair of pads all become molten at the common specific melting point and coalesce to form a solder joint between a pad on the package and an associated pad on the substrate with a vertical separation between the package and the substrate consistently monotonically decreasing during solder joint formation until a final separation is attained and always being within a range defined by the initial vertical separation and the final vertical separation less than the initial vertical separation, and maintaining a predetermined and a controlled final vertical separation between package and substrate selected to achieve a specified solder joint shape in combination with preselected solder volumes and pad sizes by application of a mechanical apparatus having a fixed dimension equaling the final vertical separation which fixed dimension is selected to be less than the initial vertical separation after molten solder joints form in order to control a solidified shape of each of the solder joints, the first and second volumes, pad sizes on the package and pad sizes on the substrate in combination with the fixed dimension being selected in accord with parameter interrelations to yield a solder joint with a controlled cross section joint geometry, and wherein said controlled final vertical separation is greater than a height of a single spherical solder deposit equaling the total volume of solder.

2. A method of forming solder joints as defined in claim 1 wherein the step of laterally positioning the substrate and package includes a step of using mechanical apparatus to positively maintain a desired lateral positioning.

3. A method of forming solder joints as defined in claim 2 wherein the step of laterally positioning the substrate and package includes a step of utilizing pins attached to the package and having the pins pass through holes in the substrate in order to maintain a desired lateral positioning.

4. A method of forming solder joints as defined in claim 3 wherein the step of maintaining a predetermined and controlled final separation includes adding a shoulder to the pins which rest on the substrate after solder reflow to control the final separation.

5. A solder joint assembly method for forming a plurality of solder joints with a controlled shape to interconnect a package to a substrate, comprising the steps of:

initially characterizing a desired solder joint geometry in terms of a final solder joint shape having a parabolic cross section generated in response to surface tension physical forces, evaluating physical realizability of the desired solder joint geometry in terms of the initial characterization of the joint geometry and surface tension forces, and including as variables a total solder volume for each solder joint deposited on the package and substrate, final solder joint height and pad size on the package and substrate, the variables being interrelated and defining a graphed region in which an hourglass cross section for the joint shape is attainable, depositing controlled first volumes of solder having a common specific melting point in the form of spherical bumps on individual pads of a preselected size on the package, depositing controlled second volumes of solder having a common melting point substantially identical to the common specific melting point in the form of spherical bumps on individual pads of a preselected size on the substrate, the first and second volumes of solder substantially equaling the total solder volume of each joint enabling physical realizability of the desired solder joint geometry, laterally positioning the substrate and the package adjacent to one another with associated pads of substrate and package in registration with one another, and at an initial vertical distance selected to permit adjacent paired solder bumps of package and substrate to touch and coalesce when molten, heating substrate and package to a temperature sufficient to render all solder deposits molten at the common specific melting point so that associated and adjacent solder deposits coalesce to form a solder joint, with a vertical separation between the package and the substrate during solder joint formation always being within a range defined by the initial vertical distance and a final vertical separation less than the initial vertical distance and the vertical separation constantly monotonically decreasing during solder joint formation until the final vertical separation less than the initial vertical separation is attained, controlling a final vertical separation between package and substrate selected in accord with the initially characterizing a desired solder joint geometry in terms of a final solder joint shape having a parabolic cross section generated in response to surface tension physical forces, to achieve a specified joint shape in combination with sizes of pads and volumes of solder bumps by utilizing fixed dimension mechanical support means wherein the final vertical separation equals a fixed dimension of the mechanical support means so that individual resulting solder joints have controlled shapes, and the interrelated first and second volumes, pad sizes on the package and pad sizes on the substrate and final vertical separation being selected in accord with parameter interrelations to yield a solder joint with a substantially hourglass joint geometry.

6. A method of forming solder joints having a controlled geometrical shape and volume and joining a package and a substrate comprising the steps of:

Characterizing a desired solder joint geometry in terms of a final joint shape having a definable substantially conical curve geometric cross section, and which characterization interrelates variables such as solder volume, pad size and joint height which variables define a joint geometry, evaluating physical realizability of the desired solder joint geometry of the desired solder joint in terms of the characterization of the joint geometry and including as variables initial total solder volume for each solder joint deposited in package and substrate, final solder joint height and pad size in package and substrate, depositing solder having a common specific melting point in the form of a plurality of spherical bumps of a first controlled volume on individual conductive pads of controlled size on the package, depositing solder having a common melting point substantially identical to the common specific melting point in the form of a plurality of spherical bumps of a second controlled volume on individual conductive pads of controlled size on the substrate, a sum of the first and second controlled volume substantially equaling the initial total solder volume, positioning substrate and package adjacent each other with conductive pads of each in registration with associated conductive pads of the other and a plurality of associated solder bumps touching each other so as to maintain an initial separation between the package and the substrate, heating the package and the substrate to a predetermined reflow temperature so that associated ones of all the solder bumps melt at the same time and coalesce to form individual solder joints, with a vertical separation between the package and the substrate during solder joint formation always being within a range defined by the initial vertical distance and a final vertical separation less than the initial vertical distance and the vertical separation constantly monotonically decreasing during solder joint formation until the final vertical separation less than the initial vertical separation is attained, and applying a fixed dimension mechanical apparatus to establish the final controlled distance equaling the fixed dimension in order to control a shape of the overall solder joint formed when two adjacent and associated solder bumps coalesce, and the interrelated variables being selected to define a joint geometry having an hourglass shaped cross section.

7. A method for forming solder joints as defined in claim 6 wherein the step of positioning the substrate and package adjacent each other includes utilizing mechanical apparatus to assure lateral alignment of the package and substrate.

8. A method for forming solder joints as defined in claim 7 wherein the step of positioning the substrate and package includes a step of attaining pins to the package which engage holes in the substrate.

9. A method of forming solder joints for joining a package and substrate, comprising the steps of:

depositing substantial, predetermined and controlled volumes of solder on individual pads of a package, each of these pads having a predetermined and controlled size and shape, depositing substantial, predetermined and controlled volumes of solder on individual pads of a substrate, each of these pads having a predetermined and controlled size and shape, laterally positioning the substrate and package adjacent to each other with individual pads of the package in registration with associated individual pads of the substrate by shaping associated volumes of solder on the package and substrate so that they interlock to sustain a desired lateral position, establishing an initial vertical between the package and substrate by utilizing a physical contact of certain of first controlled volumes of solder with their associated second controlled volumes of solder, the initial vertical separation being small enough to allow the predetermined and controlled volumes of solder on each associated pair of pads to touch and coalesce when molten, applying sufficient heat to an assembly of the package and substrate to achieve a predetermined reflow temperature, such that the first and second volume of solder on each associated pair of pads become molten and coalesce to form a solder joint between a pad on the package and an associated pad on the substrate, and maintaining a predetermined and controlled final separation between package and substrate after molten solder joint form in order to control a solidified shape of each of the solder joints.

* * * * *